United States Patent [19]

Wang

[11] 4,243,946
[45] Jan. 6, 1981

[54] CLASS-B CURRENT SOURCE AMPLIFIER

[76] Inventor: Chien S. Wang, 1201 Hudson St., Denver, Colo. 80220

[21] Appl. No.: 907,803

[22] Filed: May 19, 1978

[51] Int. Cl.³ ............................................ H03F 3/30
[52] U.S. Cl. .................................... 330/265; 330/266
[58] Field of Search ...................... 330/265, 266, 289

[56] References Cited

U.S. PATENT DOCUMENTS

| 2,855,468 | 10/1958 | Lohman | 330/265 |
| 3,042,875 | 7/1962 | Higginbotham | 330/265 X |
| 3,376,388 | 4/1968 | Reiffin | 330/265 X |
| 3,484,867 | 12/1969 | Babcock | 330/266 |

Primary Examiner—James B. Mullins
Attorney, Agent, or Firm—Burton & Dorr

[57] ABSTRACT

A highly efficient class-B current source audio amplifier with little heat generation having one amplifier half fixedly biased with the other amplifier half slave biased to the first. Each amplifier half contains a tandem chain of unmatched transistors. The first amplifier half has separate ambient and load temperature controls to substantially minimize distortion due to any change in the operating characteristics of the transistor chains and to substantially minimize the possibility of power transistor failures due to overheating.

18 Claims, 13 Drawing Figures

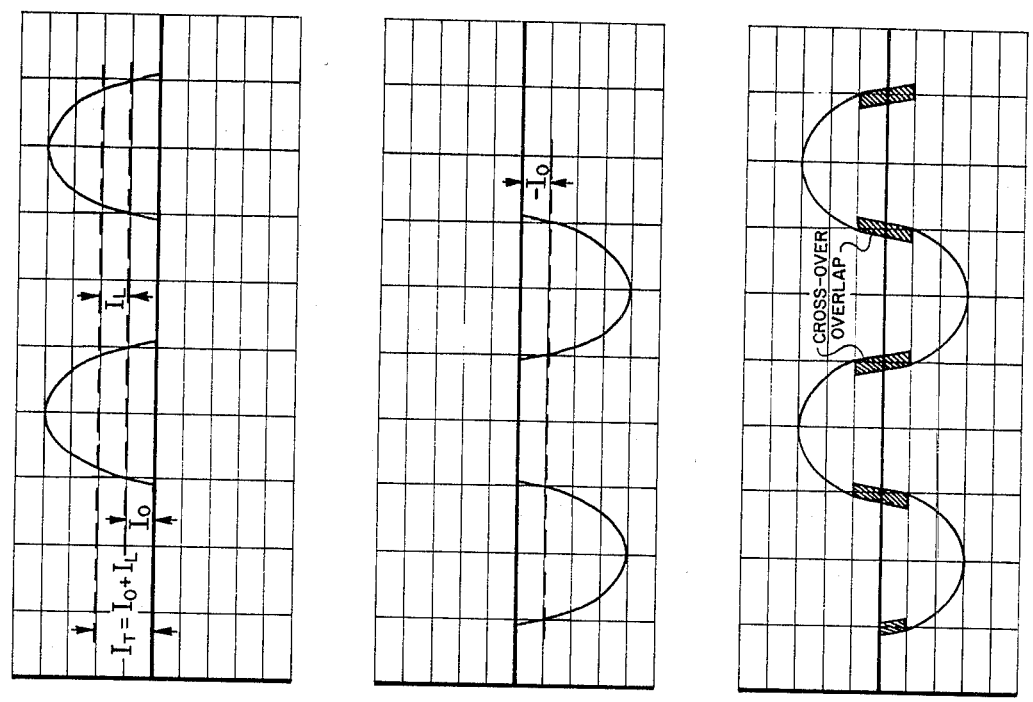
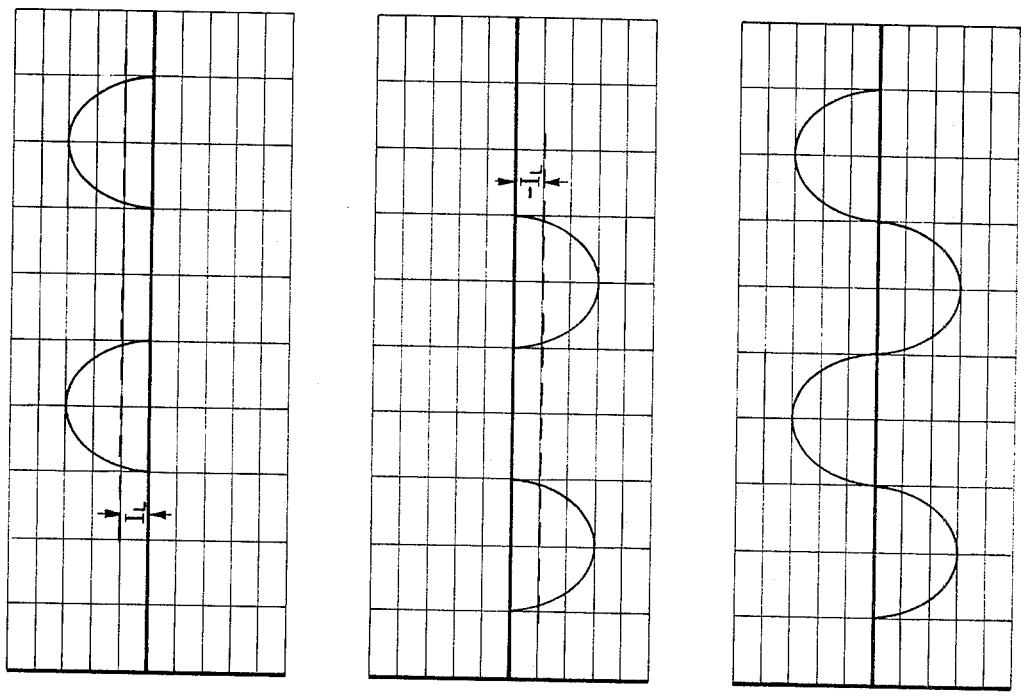

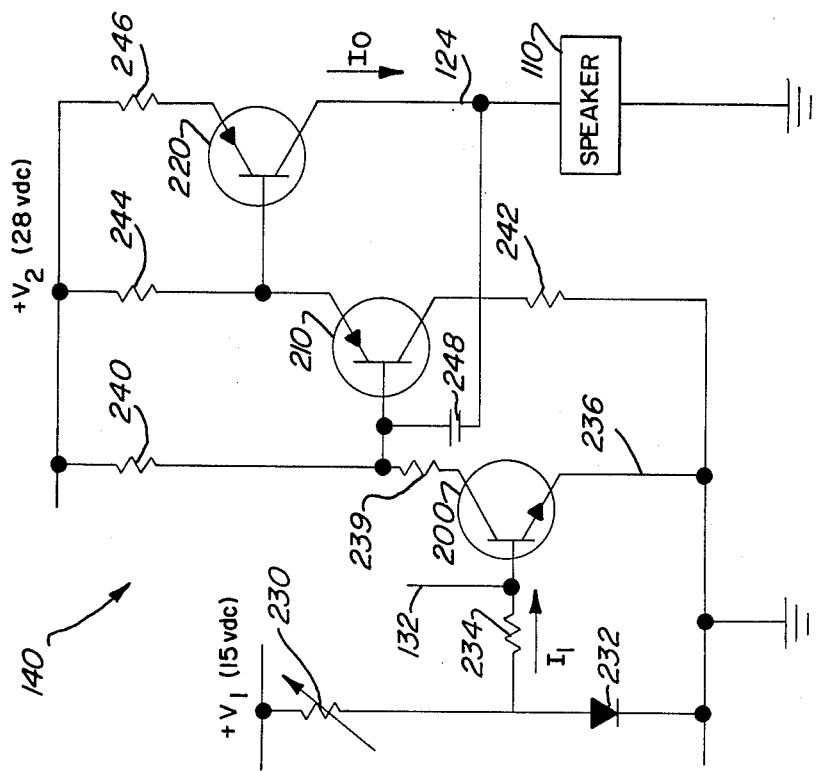
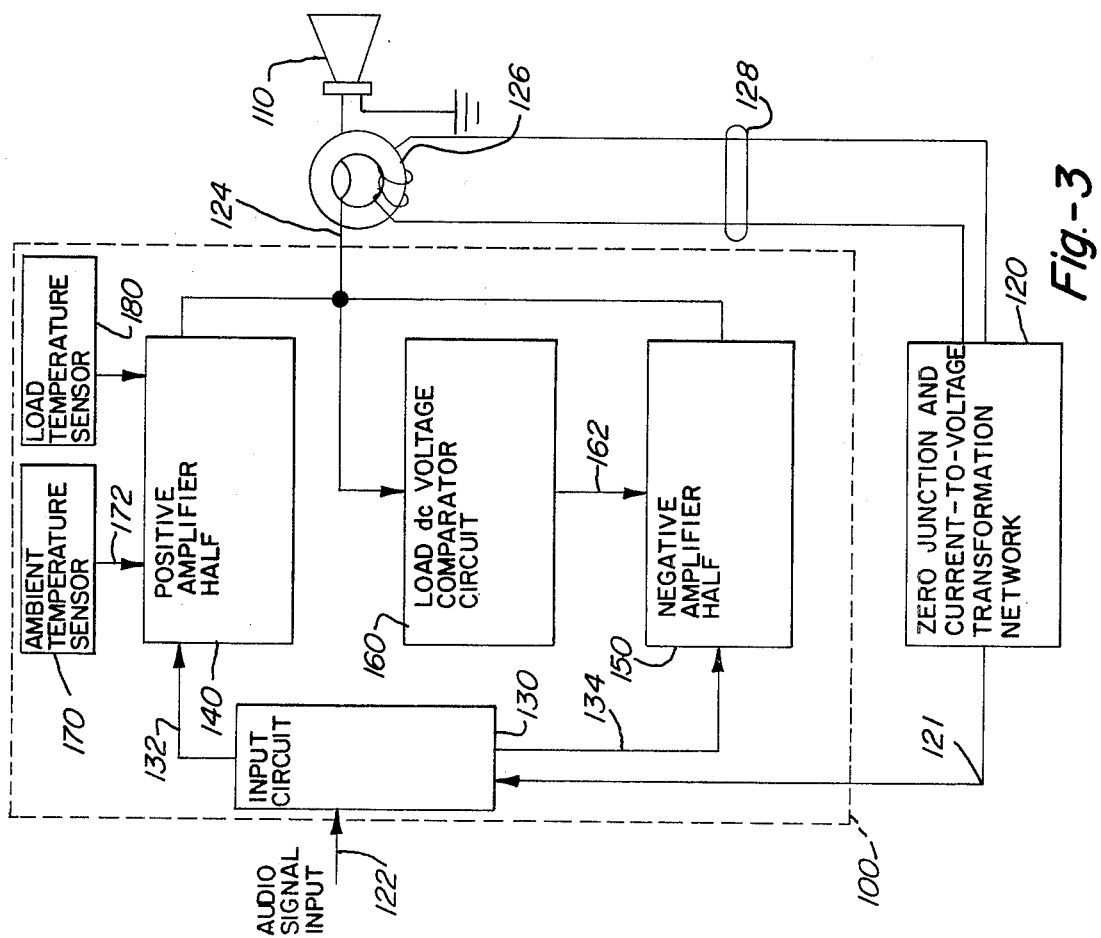
Fig.-4
Fig.-3

CLASS-B CURRENT SOURCE AMPLIFIER

BACKGROUND OF THE INVENTION

1. Field of the Invention

The invention relates to the field of audio power amplifiers and, more particularly, to class-B current source audio power amplifiers.

2. Discussion of the Prior Art

With the advent of germanium and silicon power transistors, audio amplifier design rapidly improved due to the elimination of the prior expensive and cumbersome output transformers. However, inherent difficulties of solid state power amplifiers presented themselves and such difficulties included poor linearity of the power transistors and their associated temperature instability.

Modern and conventional power audio amplifiers are primarily a voltage source type (i.e. constant voltage) and the majority of this type have their power transistors connected as emitter-followers for best linearity. With this kind of design, the driving stage must, besides furnishing a high fidelity driving voltage, which is the same magnitude as the output voltage, carry the burden of providing the necessary bias for the output power transistors. Thus, over biasing of the power transistors will cause excessive heating and under biasing of the power transistors will cause distortion. Various techniques have been used to solve these problems. These solutions are usually massive, complicated, expensive and inefficient. For example, purposefully over biasing the power transistor improves fidelity and, large heat sinks are used around the power transistors to maintain temperature stability thereby minimizing any load variations. In this regard, the power transistors are purposely operated at a higher temperature level so that the power transistors are placed in massive heat sinks thereby minimizing changes caused by temperature due to ambient temperature and load variations. In addition, complicated arrangements have been generated for the thermal protection of the power transistors.

Modern amplifier designs have sought to reduce any type of distortion such as intermodulation, harmonic, cross-over and phase distortions. However, a more subtle variety of distortion has now presented itself termed transient intermodulation distortion.

In ordinary class-B amplifier design enough overlap presents itself at the cross-over region that there is no cross-over distortion under steady state tests. However, under transient conditions, the cross-over region breaks down to display a kind of distortion similar to cross-over distortion now termed transient intermodulation distortion. Prior art remedies are (1) to operate the amplifier as class-AB (excessive overlap) where the overlap at the cross-over region is excessive, (2) to operate as the amplifier as class-A with 100% overlap, and (3) to distribute feedback at different stages of amplification. Amplifiers using remedies (1) and (2) above exhibit excessive heat loss.

In Jan Lohstroh and Matti Otala's article entitled "An Audio Power Amplifier for Ultimate Quality Requirements", published in the IBEE Transactions on Audio and Electro-acoustics, Volume AU-21, No. 6, December 1973, the authors discuss transient intermodulation distortion and propose a complimentary symmetrical audio amplifier minimizing all distortion including transient intermodulation distortion. This article provides a good discussion of the background of the prior art with relation to audio amplifier design and distortion. The amplifiers presented and discussed in this article, however, relate to voltage type power amplifiers and not to current source amplifiers.

One of the most common forms of audio amplifier design is the class-B. The final stage of amplification in this class of amplification is split into two halves so that at any given moment only one half is producing sound. This results in an efficient method of amplification since no one transistor or output tube need do all the work by itself. However, the two halves, in a class-B amplifier, must be rigidly controlled by other circuits and must be very carefully matched in characteristics or considerable distortion can result.

In the theoretical sense, an ideal class-B amplifier amplifies only one half of a cycle at a time and as illustrated in FIG. 1, the quiescent dc current, $I_o$, is zero. However, the presence of loading current, $I_l$, through each amplifier half causes heating.

In a practical sense, cross-over distortion is always present and a residual current, $I_o$, is *allowed* to flow. The practical result is shown in FIG. 2 where the positive waveform overlaps with the negative waveform to eliminate cross-over distortion. As can be seen, the operation cycle of each amplifier half is actually greater than ½ cycle. And, in this situation, the dc component is now:

$$I_t = I_L + I_o$$

It is evident that the output power transistor for each half operates at a higher temperature due to the combined values of $I_L$ and $I_o$. When the load is removed, the amplifier returns to its quiescent condition and two possibilities present themselves. First, and most common, the output current $I_t$ will return to its original value of $I_o$ and, second, $I_o$ will progressively increase and cause output power transistor failure. In practical class-B amplifiers, the two halves are carefully constructed with components having identical characteristics.

U.S. Pat. No. 3,542,952, entitled "Low Distortion Signal Reproduction Apparatus", issued on Nov. 24, 1970, to this inventor sets forth a novel current source amplifier design. The present invention incorporates the teachings of this earlier patent issued to the inventor and produces a true class-B current source amplifier with substantially reduced intermodulation, harmonic, cross-over, phase and transient intermodulation distortions. It is important to understand that these terms have been generated to classify distortion appearing in voltage power amplifiers and the use of these terms to describe distortion in current source amplifiers may be inappropriate. In any event, the present invention minimizes any and all distortion.

The cross-over region overlap determines the heating of the power transistor. In class-AB operation, the heating is very high (as explained before) and excessive overlap is used to reduce transient intermodulation distortion. In ordinary amplifier (voltage type), the coupling between amplifier and loudspeaker load is loose, under transient condition there is a tendency to break loose causing transient distortion. In the current source amplifier set forth below, the coupling between two is stiff and, therefore, the current source amplifier can be operated at minimum overlap for low distortion with little heating.

The present invention, contrary to the entire thrust of audio design which is concentrating on voltage feedback and voltage power amplifier arrangements, utilizes a current source amplifier (constant current type) with a single feed-back loop. The amplifier is of the class-B type and has an extremely high open-loop gain, extremely low distortions, excellent transient response, and overall temperature stability. Under the teachings of this invention, a true class-B audio power amplifier is realized where the cross-over overlap is adequate for low distortion but is minimized for low heating of power transistors. The amplifier is designed with current coupled transistor stages instead of the conventional emitter-follower type with an extremely high open-loop gain. This is not possible to achieve with the conventional emitter-follower amplifier design principles.

A novel biasing scheme and principle is introduced in the present invention for current source audio power amplifiers where one amplifier half is fixedly biased while the other amplifier half is slave biased to the first half in order to maintain the dc output voltage level at zero. Thus, in reference to FIG. 2, in the present invention the heating of the power transistors due to load or due to the environment automatically reduces $I_o$ to check the progressive increase of $I_o$ due to leakage. Since, in the present invention, the negative amplifier half is slave-biased to the positive amplifier half, only $I_o$ in the positive half is adjusted which causes a corresponding adjustment of $-I_o$ in the negative half. More importantly, the two halves in the present invention are automatically balanced so that there is no resultant dc load current at the output.

This is not possible with the conventional class-B amplifiers where the biases of the two amplifier halves cannot be separated. The amplifier of the present invention is separately biased completely contrary to the prior art and approaches. Each amplifier half of the present invention is composed of a tandem chain of transistors direct current coupled to achieve high current gain. The first half is termed the positive half which delivers the positive going output signals and the second half is termed the negative half to deliver the negative going output signals.

In another principle of this invention, since the negative amplifier half is slave biased to the positive amplifier half, the corresponding transistors need not be matched in characteristics. This results in a considerable cost reduction and improvement over prior art approaches.

In another principle of this invention, as mentioned, the temperature of only one of the power transistors is sensed. When the temperature of the power transistor increases due to increasing load demands, the input biasing current to the amplifier is reduced. Therefore, as one power transistor gets warm or hot the temperature sensor causes the bias to both power transistors to be automatically reduced. As the temperature of the one power transistor decreases, the bias currents to both are automatically increased. Only one power transistor (on the positive half) need be sensed since the two amplifier halves operate in a slave biased arrangement.

Another principle of the present invention relates to a temperature sensor for sensing the ambient temperature of the amplifier. Like the load temperature sensor, the input bias is automatically adjusted to maintain the amplification. Therefore, the two amplifier halves of the present invention work in unison to maintain the output voltage at zero volts dc, regardless of operating levels, power transistor mismatches, and temperature variations.

The circuitries presented are simple and straight forward to be assembled and manipulative and, moreover, the amplifier is efficient, inexpensive to build, and reliable. Moreover, with a high open-loop gain, the fidelity and transient responses are extremely excellent.

OBJECTS OF THE INVENTION

It is an object of the present invention to provide a novel class-B current source amplifier exhibiting extremely low distortion characteristics.

It is a further object of the present invention to provide a novel class-B audio current source amplifier having high quality audio current output with a minimum number of component parts.

It is another object of the present invention to provide a novel class-B current source amplifier in which the two amplifier halves have corresponding components which are unmatched.

It is another object of the present invention to provide a novel class-B current source amplifier having one of the two amplifier halves fixedly biased with the second amplifier half being slave biased to the first.

It is another object of the present invention to provide a true class-B amplifier where the crossover overlap although minimized does not breakdown under transient conditions.

It is another object of the present invention to provide a true class-B amplifier having high efficiency with low heating by minimizing the biasing currents to the two amplifier halves.

It is another object of the present invention to provide a novel temperature control arrangement for power transistors in audio amplifiers.

It is another object of the present invention to provide a novel ambient temperature control for an audio amplifier.

It is another object of the present invention to provide a novel class-B current source amplifier in which each of the amplifier halves is composed of a tandem chain of transistors.

It is also an object of the present invention to provide a novel class-B current source amplifier wherein a voltage at its output is held at zero volts dc at quiescent or operational conditions.

It is, therefore, an object of this invention to provide a novel class-B current source amplifier exhibiting extremely low distortion having a first amplifier half fixedly biased and a second amplifier half slave biased to the first wherein the corresponding components of each amplifier half are unmatched and are comprised of a chain of tandemly direct current coupled transistors and wherein one amplifier half has a load temperature sensing arrangement and an ambient temperature sensing arrangement each of which are capable of maintaining the first half at a constant dc quiescent current and to match the signal gain of the negative amplifier to be the same as the signal gain of the positive half characteristic.

Other objects, advantages and capabilities of the present invention will become more apparent as the description proceeds taken in conjunction with the accompanying drawings.

SUMMARY OF THE INVENTION

In accordance with the various objects of this invention, a novel class-B current source amplifier having a fixedly biased positive amplifier half for delivering positive output audio signals and a slave-biased negative amplifier half for delivering negative output audio signals as is disclosed.

The positive amplifier half includes first, second, and third transistors direct current coupled in tandem for amplifying the incoming signal and delivering the positive going portions of the audio signal to load. A dc biased current is provided to the positive amplifier half which is also amplified and applied to the input of the load. The dc bias current is positioned to keep the transistor tandem chain alive, yet sufficiently small but adequate to prevent crossover distortion. A temperature sensitive diode may optionally be physically placed near the outer casing of the third transistor which is a power transistor so that as the temperature of the outer casing increases due to increasing load demands, the diode causes the dc bias current to decrease thereby maintaining the amplification. And, a thermister may optionally be placed in the ambient environment to provide comparable control of the bias current for changes due to increasing environmental temperature.

A negative amplifier half is provided having components which are unmatched from the corresponding components in the positive amplifier half and which is slave biased to the positive amplifier half. The negative amplifier half, like the positive amplifier half, also uses three transistors tandemly connected in a chain.

The differential amplifier senses any dc voltage potential at the input to the loudspeaker load and compares that value to a predetermined voltage value and generates a control voltage whose variation is proportional to the differential voltage between the predetermined value and the sensed dc voltage potential appearing at the input to load. The negative amplifier half, rather than being fixedly biased, is receptive of this dc control voltage from the differential amplifier and accordingly adjust the input bias to the first transistor stage of the negative amplifier half in order to electronically match the output signal to that from the positive amplifier half so that the result in dc voltage potential at the input to the load is zero volts dc.

Foregoing objects in many of the intended advantages of this invention will become more readily appreciated as the same becomes better understood by reference to the following description when taken in conjunction with accompanied drawings.

DESCRIPTION OF THE DRAWING

FIG. 1 sets forth the output characteristics of an ideal class-B amplifier.

FIG. 2 sets forth the output characteristics of a practical class-B amplifier.

FIG. 3 is a functional block diagram of the major components of the class-B current source audio amplifier of the present invention interconnected with a feedback network of the low distortion signal reproduction apparatus.

FIG. 4 is a schematic diagram of a first embodiment of the positive amplifier half of the present invention.

GENERAL SPECIFICATION

Figure 6:
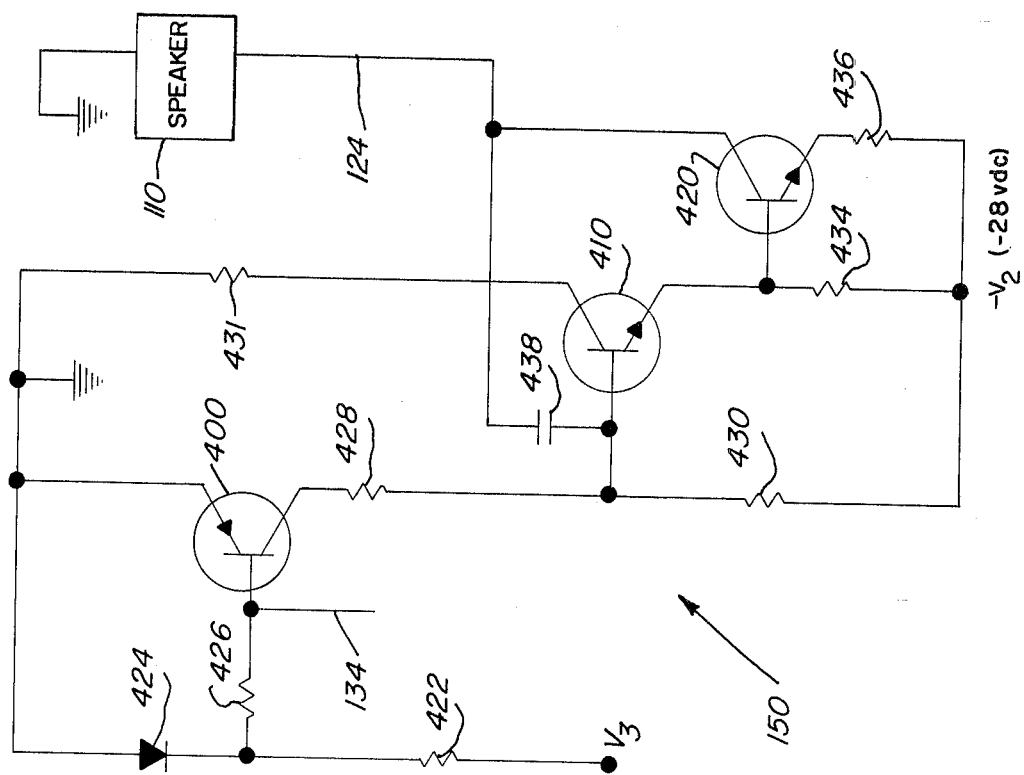
FIG. 6 is a schematic diagram of a first embodiment of the negative amplifier half of the present invention.

In FIG. 3 the components of a current source amplifier including the amplifier of the present invention 100, a speaker 110, and a feedback network (for example, of the type disclosed in U.S. Pat. No. 3,542,952) for transforming the amplifier into a current source type. An input audio signal 122 is delivered into the amplifier 100 and the amplified signal is placed on lead 124 which drives the loudspeaker load 110 in a conventional fashion. A toroidal core transformer 126 senses the current fluctuations in the signal on lead 124 and delivers an electrical signal to current to voltage conversion network which processes those signals and delivers it into the amplifier 100 over lead 121 as a feedback signal which minimizes distortion of the current output. The use of the toroidal core transformer 126 and zero junction and current to voltage transformation network 128 is set forth in U.S. Pat. No. 3,542,952 and do not form a part of the present invention.

Rather, as shown in FIG. 3, the present invention relates to the design of amplifier 100 which includes an input circuit 130, a positive amplifier 140, a negative amplifier half 150, and a dc load voltage comparative circuit 160. The positive amplifier half is further controlled by an ambient temperature sensor 170 and a load temperature sensor 180. These components function in the following manner.

The audio signal on lead 122 together with the feedback signal on lead 121 is delivered to the input circuit 130 which delivers the combined signal to the positive amplifier half 140 over lead 132 and to the negative amplifier half 150 over lead 134. The positive amplifier half amplifies the incoming signal and delivers the amplified positive signal to load lead 124. Likewise, the negative amplifier half 150 amplifies the incoming signal from lead 134 and delivers the amplified negative signal to load lead 124. Therefore, in a true class-B design the positive amplifier half 140 drives speaker 110 for the positive output while the negative amplifier half 150 drives the speaker 110 with the negative output.

As will be discussed in greater detail later, the internal corresponding components of the positive amplifier half 140 and that of the negative amplifier half 150 are not matched, and therefore, an unbalanced dc voltage may well appear on lead 124. To eliminate this unbalanced voltage condition due to the unmatched internal components, a dc load voltage comparator circuit 160 senses any dc voltage appearing on lead 124 and causes the negative amplifier half 150 to adjust the level of its dc voltage output thereby maintaining a zero dc voltage output level on lead 124. Therefore, the dc load comparator circuit 160 receives the voltage appearing on load lead 124 and generates a controlling voltage for biasing over lead 162 to the negative amplifier half 150. In essence, the positive amplifier half 140 operates at a fixed bias to place a signal on the load lead 124, (which includes a dc level) the negative amplifier half 150 is slave biased to the positive amplifier half through the comparator output lead 162 and it automatically compensates for any mismatching it may have with the positive amplifier half 140.

Often audio amplifiers operate in a range of different temperature environments, such as auto audio amplifiers. Such temperature variations cause the internal components to operate at different points in their current-voltage characteristics thereby causing distortions to occur. In a manner to be subsequently discussed, the ambient temperature sensor 170 senses the ambient temperature in the physical proximity of the entire amplifier and delivers a signal over lead 172 to the positive amplifier half 140 causing the positive amplifier half to maintain its fixed dc quiescent current level despite ambient temperature variations by increasing or decreasing the bias level on lead 132.

As previously meantioned severe distortion and component failure can occur when the power transistor heats up due to increasing load demands. In a similar fashion to the ambient temperature sensor, the load temperature sensor 180 is positioned in close proximity to the output power transistor in the positive amplifier half 140. When the temperature of the power transistor increases due to increasing load demands, the bias level is appropriately adjusted to maintain the positive amplifier at a fixed dc quiescent current level. In either case, the resulting temperature increase or decrease may cause distortion due to the signal being amplified at different points on the current-voltage characteristics of the internal components. By adjusting the bias level to the positive amplifier half, the same proximity of amplification on the current-voltage characteristic is substantially preserved. It follows, that the negative amplifier half 150 being slave biased will correspondingly be temperature compensated since the level bias for the input of the positive amplifier half 140 is amplified to appear as a dc voltage at the output on lead 124 causing an unbalanced voltage condition and will be sensed by the comparator 160 to deliver a control voltage over lead 162 to correspondingly adjust the bias level to the input of the negative amplifier half 150 in order to maintain the voltage on lead 124 at zero volts dc.

In summation, therefore, a true class-B current source amplifier is described in FIG. 3 in block diagram components to include an electronically matched positive and negative halves 140 and 150 which need not have matched internal corresponding components with identical characteristics. Furthermore, the amplifier 100 is responsive to ambient temperature and to load temperature to maintain the amplification at a nearly fixed value. The amplifier halves are separately biased with the negative amplifier half 150 being slave biased to the positive amplifier half 140. Of course, it is to be understood that the positive amplifier half could have easily been slave biased to the negative amplifier half and further, the ambient and load temperature sensors 170 and 180 could also appear on the negative amplifier half 150. It is to be noted, that due to the slave biasing technique herein presented, only one amplifier half needs to be temperature compensated since due to the slave biasing, it is reflected into the other amplifier half. As will become apparent in the following, to accomplish this electronically stable and low distortion amplifier, requires only a minimum amount of circuitry.

DETAILED DESCRIPTION

Positive Amplifier Half

In FIG. 4 is shown a first embodiment of the positive amplifier half 140 which is not ambient or load temperature compensated. This embodiment, shown in FIG. 4 utilizes three transistors, 200, 210 and 220 direct current coupled tandemly connected in a chain. Bias level voltage is delivered through a potentiometer 230 and through a series connected diode 232 to ground. Between the potentiometer 230 and diode 232 is a resistor 234 which is connected to the base of transistor 200. The input signal from the input circuit 130 appearing on lead 132 is delivered into the base of transistor 200. The transistor 200 has its emitter connected to ground over lead 236 and has its collector connected through resistor 239 and resistor 240 to plus voltage $V_2$ which is 28 volts in the preferred embodiment. The amplified signal current from the collector of transistor 200 is delivered through resistor 239 into the base of transistor 210. The collector of transistor 210 is connected to ground through resistor 242 and the major part of the emitter current is delivered into the base of transistor 220. Transistor 220 is a power transistor which has its emitter connected through resistor 246 to positive voltage $V_2$ and has its collector connected to lead 124 for driving the loudspeaker load 110. A high frequency by-pass capacitor 248 is also provided as shown.

The positive amplifier half 140 shown in FIG. 4 operates in the following fashion. Transistors 200, 210 and 220 are interconnected in a tandem chain so that the output dc current $I_O$ flowing out from the collector of power transistor 220 is practically equal to the input current $I_I$ flowing into the base of transistor 200 times the dc current gains of the transistors. It is to be noted that transistor 200 is of NPN type whereas transistors 210 and 220 are of PNP type. Due to the high dc current gain, the dc biasing current into the base of transistor 200 must be a very small magnitude such as a fraction of a microamperes. The positive voltage $V_1$ is at a fixed level and the bias current to the diode 232 is adjusted by a potentiometer 230 so that the voltage drop across 232 is slightly higher than the junction voltage across the base and emitter of transistor 200. Bias current, $I_I$, is of such magnitude so that the output current, $I_O$ (quiescent current) from the positive to negative amplifier halves is of the proper magnitude. Therefore, there is no gap at the cross-over region in the output signal wave pattern.

Figure 5:
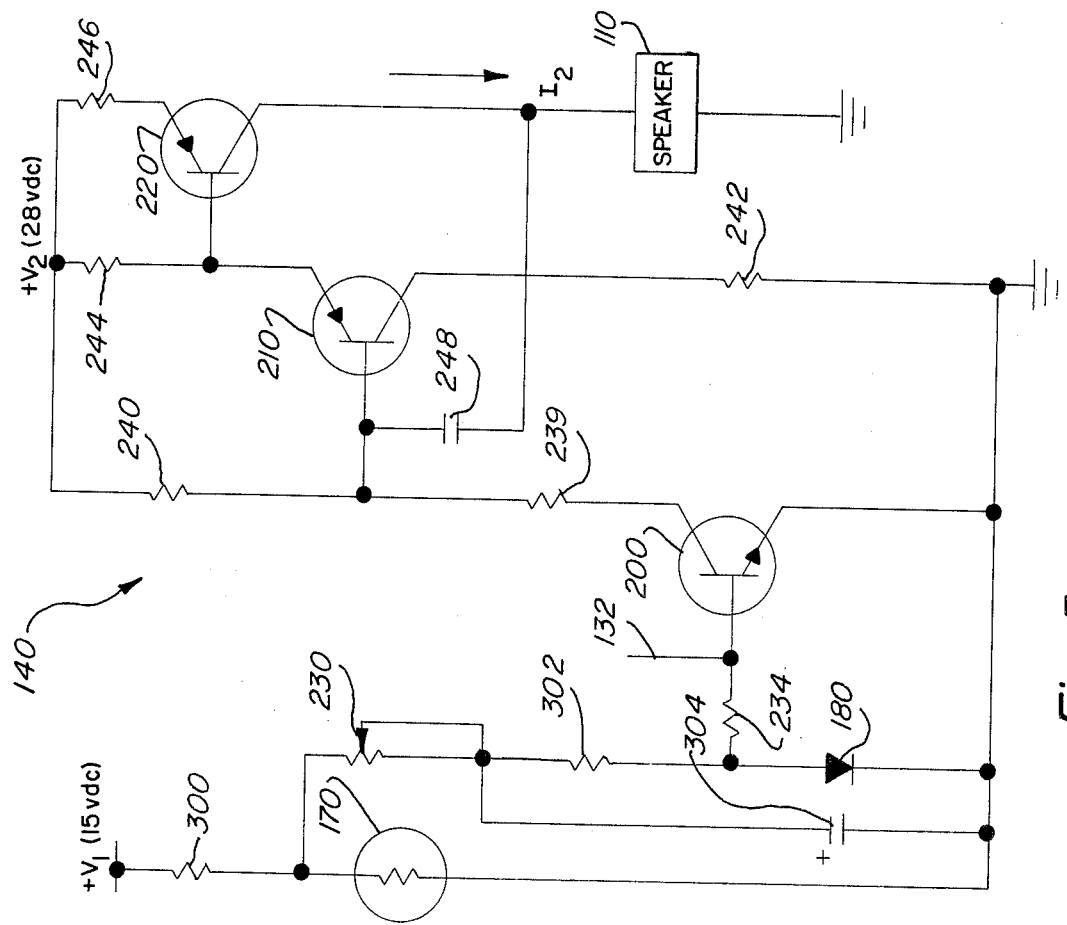
FIG. 5 is a schematic diagram of a second embodiment of the positive amplifier half of the present invention.

In FIG. 5 is shown a second embodiment for the positive amplifier half 140. In this embodiment, provision is made for control by the ambient temperature sensor 170 and the load temperature sensor 180 shown in FIG. 3. It is to be expressly understood, that while the following embodiment discloses the use of two temperature sensors, either one or the other may be incorporated. Thus, for example, the load temperature sensor 180 could be eliminated and/or the ambient temperature sensor 170 could be eliminated or added as required. The corresponding components shown in FIG. 4 are likewise designated in FIG. 5.

As shown in FIG. 5, the ambient temperature sensor 170 is placed in a voltage divider network with resistor 300. The potentiometer 230 is tapped into the voltage divider network between thermistor 170 and resistor 300. Therefore, as the ambient temperature increases, the resistance of thermistor 170 decreases and also its voltage and less current is delivered through potentiometer 230. When the ambient temperature decreases, thermistor 170 increases its resistance and also its voltage providing for greater current flow through potentiometer 230. The junction voltage at resistor 302 and at diode 180 provides a current delivered through resistor 234 and into the transistor chain as priorly discussed. Capacitor 304 is connected in parallel with resistor 302 and diode 180.

Figure 12:
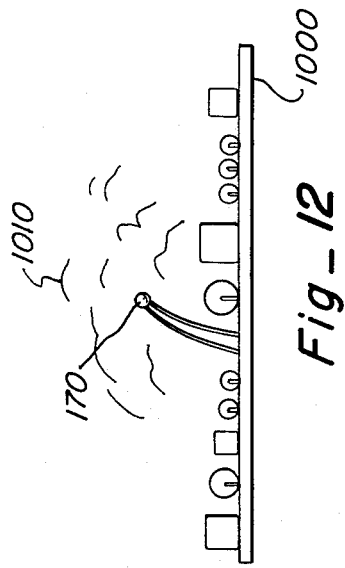
FIG. 12 is a graphic representation illustrating the placement of the ambient temperature sensor of the present invention.

As shown in FIG. 12, thermistor 170 which is physically placed above the circuit board 1000 so that it substantially senses the ambient temperature in the environment 1010 surrounding the circuit board 1000.

There are two conditions causing an environmental (or ambient) temperature increase. Hot weather is a first cause; in this situation the environmental temperature increases, making the power transistor draw more quiescent current (if uncompensated) and the power supply will provide more current. Hence, the power transformer will provide more current and it commences to heat up. The heating of the power transformer is the main cause of further temperature increase inside the cabinet. The heating of power transformer is due to iron and copper loss. High load conditions are a second cause and will increase the temperature of the power transistor by itself. The temperature of the environment may not be increased too much, but the power transformer is the main cause of environment temperature change. The effect will be cumulative if unchecked.

The ambient temperature sensor 170 operates in the following manner. Potentiometer 230 is initially adjusted to provide a bias voltage across resistor 302 and diode 180 so that the output current, $I_0$, will be of proper magnitude. As the ambient temperature gets higher (as for example, when the output power transistor 220 delivers a higher output current and commences to heat itself) the resistance of thermistor 170 decreases thereby dropping the bias voltage across resistor 302 and diode 180. Hence, the output current, $I_0$, will be stabilized at a fixed value. A colder environment temperature likewise raises the voltage across resistor 302 and diode 180 to a higher value to compensate for the lower current gain of the power transistor at cold temperature. As a result, the output, $I_0$, is maintained at a constant value regardless of the ambient temperature changes. This becomes important for those audio amplifier systems found in drastically changing temperature environments such as found, for example, on a boat or car.

It is well known by those skilled in the art and others that the dc current gain of a transistor increases with temperature increase due to leakage current increase from collector to base. And, this leakage current multiplies exponentially with temperature increase. This is especially true in output audio power transistors. This process continues to repeat at a very rapid or avalanching rate and is the main cause of power transistor failure in audio amplifiers when the temperature is not stabilized.

Figure 13:
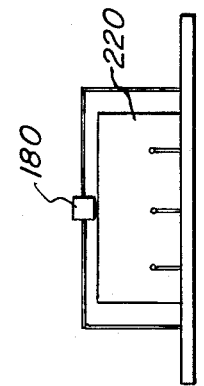
FIG. 13 is a graphic illustration setting forth the placement of the load temperature sensor of the present invention in relationship to a power transistor.

Also found in the second embodiment of the positive amplifier half 140, shown in FIG. 5, is the load temperature sensor 180 which is a diode. The voltage change across the diode 180 has a negative temperature coefficient. By placing the load temperature sensor 180 in close physical proximity to the power transistor 220 as shown in FIG. 13, the diode 180 is able to affect the level of biasing to transistor 200. Therefore, in the embodiment shown in FIG. 5, at a low level of current through the diode 180, the voltage across it rises with the increase of diode current, and with constant diode current, its voltage decreases with increase of diode temperature, and vice versa. The diode voltage across 180 and the junction voltage (base and emitter) of transistor 200 tract closely temperature-wise as the base and emitter junction of the transistor behave much like a forward biased diode. Since the diode 180 is in thermal contact with the power transistor 220 as shown in FIG. 13, the diode 180 will assume substantially the same temperature as the case of the power transistor 220 and any increase in the temperature of diode 180 lowers its voltage so that the bias current to transistor 200 will decrease thereby stabilizing the temperature of the power transistor 220 to a safe value.

The embodiment, shown in FIG. 5, is an extremely inexpensive technique for stabilizing the load temperature problem of a power transistor to a safe value even with an inexpensive and moderate amount heat sinks.

In summary, diode 180 serves as the load temperature sensor when placed in the configuration shown in FIG. 13 so that as the power transistor 220 increases its temperature with increasing loads, the bias current delivered to the base of transistor 200 is appropriately reduced in order to stabilize and maintain the operating output point on the current voltage characteristics curve at substantially the same position of transistor 220. This substantially minimizes any and all distortion that may accompany loading of the power transistor.

Hence, it is seen in FIG. 5 that the positive amplifier half 140 is properly temperature compensated for the environment influence and further has its power transistor temperature compensated to maintain it at a precise level of operation thereby eliminating distortion and lessening of heat generated within the cabinet.

NEGATIVE AMPLIFIER HALF

In FIG. 6 is shown the first embodiment for the negative amplifier half 150 of the amplifier 100 of the present invention. As with the positive amplifier half 140 shown in FIGS. 4 and 5, the negative amplifier half 150 also uses a chain of tandem transistors 400, 410, and 420—transistor 420 being a power transistor. As previously mentioned, the negative amplifier half 150 is slave biased to the positive amplifier half 140. The slave bias voltage is delivered at $V_3$ through the series connection of resistor 422 and diode (or resistor) 424 to ground. A resistor 426 connected at the node between diode 424 and resistor 422 delivers the bias level signal from $V_3$ into the base of transistor 400. Also delivered into the base of transistor 400 is the input audio signal from the input circuit 130 over lead 134. The emitter of transistor 400 is connected to ground while the collector is connected through resistor 428 and resistor 430 to a minus voltage, $V_2$, such as minus 28 volts dc. The node between resistor 428 and resistor 430 is connected to the base of transistor 410. The collector of transistor 410 is connected through resistor 431 to ground while the emitter of transistor 410 is connected both through resistor 434 to minus $V_2$ and to the base of the power transistor 420. The collector of the power transistor 420 is connected to lead 124 to drive the loudspeaker load 110 while the emitter of transistor 420 is connected through resistor 436 to the minus V₂ voltage. A capacitor 438 interconnects the base of transistor 410 to lead 124 to eliminate high frequency oscillations. This negative amplifier half 150 operates in the same fashion as previously discussed for the positive amplifier half in FIG. 2. The only difference being voltage $V_3$ which will subsequently be explained.

Figures 7, 8, 9:
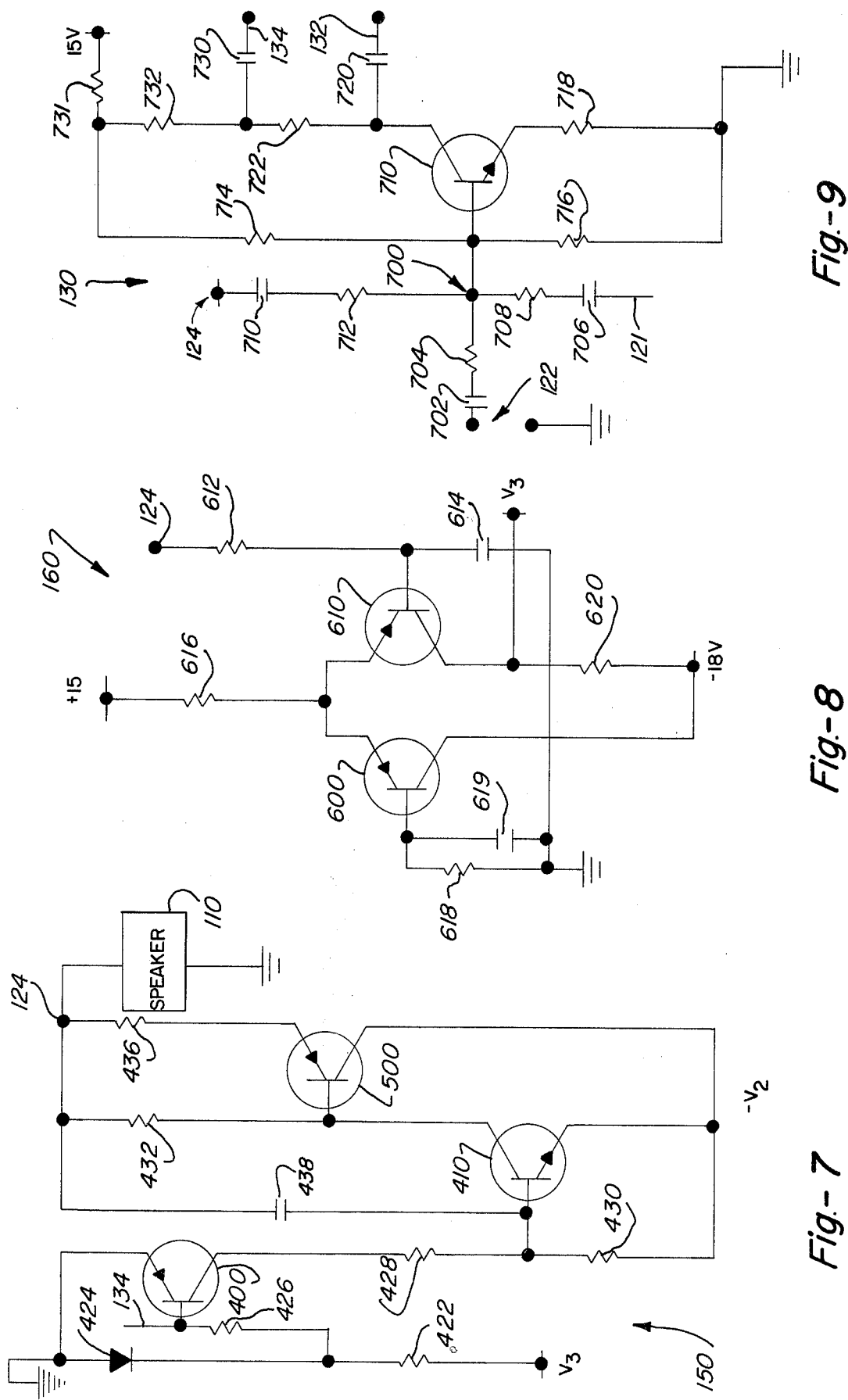
FIG. 7 is a schematic diagram of the second embodiment of the negative half of the present invention.
FIG. 8 is a schematic diagram of the dc load voltage comparator circuit of the present invention.
FIG. 9 is a schematic diagram of the input circuit of the present invention.

In FIG. 7 is shown a second embodiment of the negative amplifier half 150 which uses a quasi-complimentary arrangement for the output power transistor. In FIG. 6, the power transistor 420 is an NPN type whereas in FIG. 7 a PNP type is used for the power transistor. Where possible, similar designations retain the same reference numerals, but the output power transistor is now labeled 500 and the collector of power transistor 500 is connected to minus V₂ voltage whereas the emitter of transistor 500 is delivered through resistor 436 to the load lead 124 for driving the speaker 110. The high frequency capacitor 438 is now interconnected to the load lead 124 as shown in FIG. 7.

LOAD DC VOLTAGE COMPARATOR CIRCUIT

In FIG. 8, there is shown the dc load voltage comparator circuit 160 which is basically a differential amplifier, which includes transistors 600 and 610. The base of transistor 610 is connected to a filter network comprising resistor 612 and capacitor 614. The resistor 612 is interconnected with the load lead 124 and the filter serves to remove the ac components appearing on lead 124 and shunting such signals through capacitor 614 to ground. Only the dc component is left which is presented at the base of transistor 610. The emitters of transistor 600 and 610 are connected through a common resistor 616 to positive voltage (15 volts). The base of transistor 600 is interconnected through resistor 618 to the ground and the collector of transistor 600 is connected to a minus 18 volts. The collector of the transistor 610 is delivered through resistor 620 to the minus 18 volt supply and is further delivered to the negative amplifier half as dc voltage source $V_3$.

In operation, if the dc voltage appearing on the load lead 124 is positive, the voltage $V_3$ produced by the comparator circuit 160 will be negative of proper magnitude thereby providing negative bias current into the base 400 of the negative amplifier half 150. As a result, the quiescent negative current output of the negative amplifier half will be increased and the output dc voltage will be quickly brought to zero. On the other hand, if the output dc voltage appearing on lead 124 is negative, the differential amplifier 160 causes the voltage $V_3$ to provide less negative voltage to the base of transistor 400 thereby once again bringing the output voltage on 124 rapidly back to zero. Therefore no dc current is delivered into the speaker 110.

Quiescent dc current, in prior art arrangement, cause heating of the power transistors. This slave bias arrangement, the quiescent dc current is kept at a minimum thereby reducing heating but is enough to prevent distortion. INPUT CIRCUIT The input circuit 130, shown in FIG. 9, includes a summing junction 700 which receives the audio input signal 122 through capacitor 702 and resistor 704, the feedback signal from the zero junction and current to voltage transformation network 120 over lead 121 which accesses capacitor 706 and resistor 708, and a signal from the load lead 124 which access capacitor 710 and resistor 712.

The combined signal appearing at summing junction 700 is delivered into the base of transistor 710. Transistor 710 operates at a low level (input and output voltage are a fraction of a millivolt) whereas the signal and the feedback voltages are in the ranges of several volts at full load condition. The summing junction 700 in addition to being delivered to the base of transistor 710 is also delivered through resistor 714 to the positive 15 volt supply and through resistor 716 to ground. The emitter of transistor 710 is delivered through resistor 718 to ground whereas the collector is delivered through capacitor 720 to the positive amplifier half over lead 132. The collector of transistor 710 is also delivered through resistor 722 which in turn is delivered through capacitor 730 which accesses the negative amplifier half over lead 134. And finally, the collector of transistor 710 is delivered through resistor 722 and through resistor 732 to positive 15 volts supply.

The feedback signal appearing on lead 121 is fully discussed in U.S. Pat. No. 3,542,952 and has for its purpose a novel approach for substantially minimizing all distortion and converts this amplifier to a current source type. The signal appearing from lead 124 to the base through resistor 712 and capacitor 78 provides high frequency roll-off to about 30 kHz to limit the high frequency response of the amplifier.

ZERO JUNCTION AND CURRENT TO VOLTAGE TRANSFORMATION NETWORK FOR FEEDBACK

Figure 10:
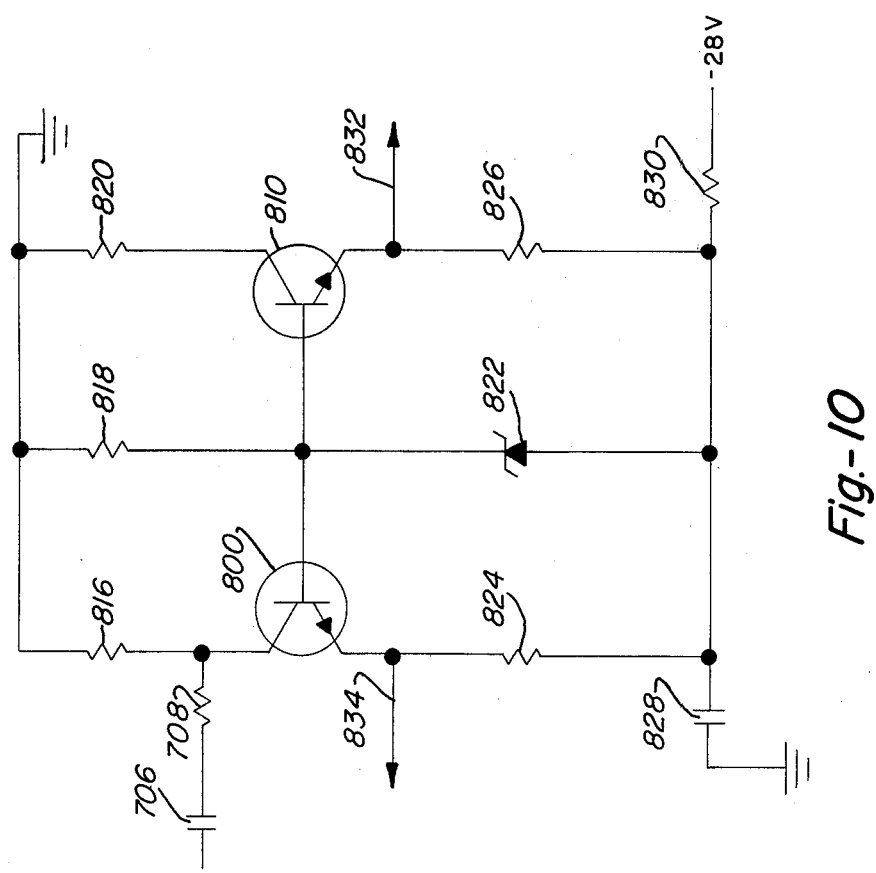
FIG. 10 is a schematic diagram of zero junction and current to voltage convertion network of a low distortion signal reproduction apparatus used by the present invention.

As previously mentioned this circuit is fully disclosed in U.S. Pat. No. 3,542,952 and, the detailed circuit shown in FIG. 10 corresponds identically with FIG. 6 in the aforementioned patent but for the substitution of a diode 822 for a resistor (resistor R14 in FIG. 8). Whether or not a diode or resistor is used is optional, the use of the diode results in a circuit not as sensitive to voltage changes. Therefore, the teachings of U.S. Pat. No. 3,542,952 are hereby incorporated by reference.

COMPLETE AMPLIFIER

Figure 11:
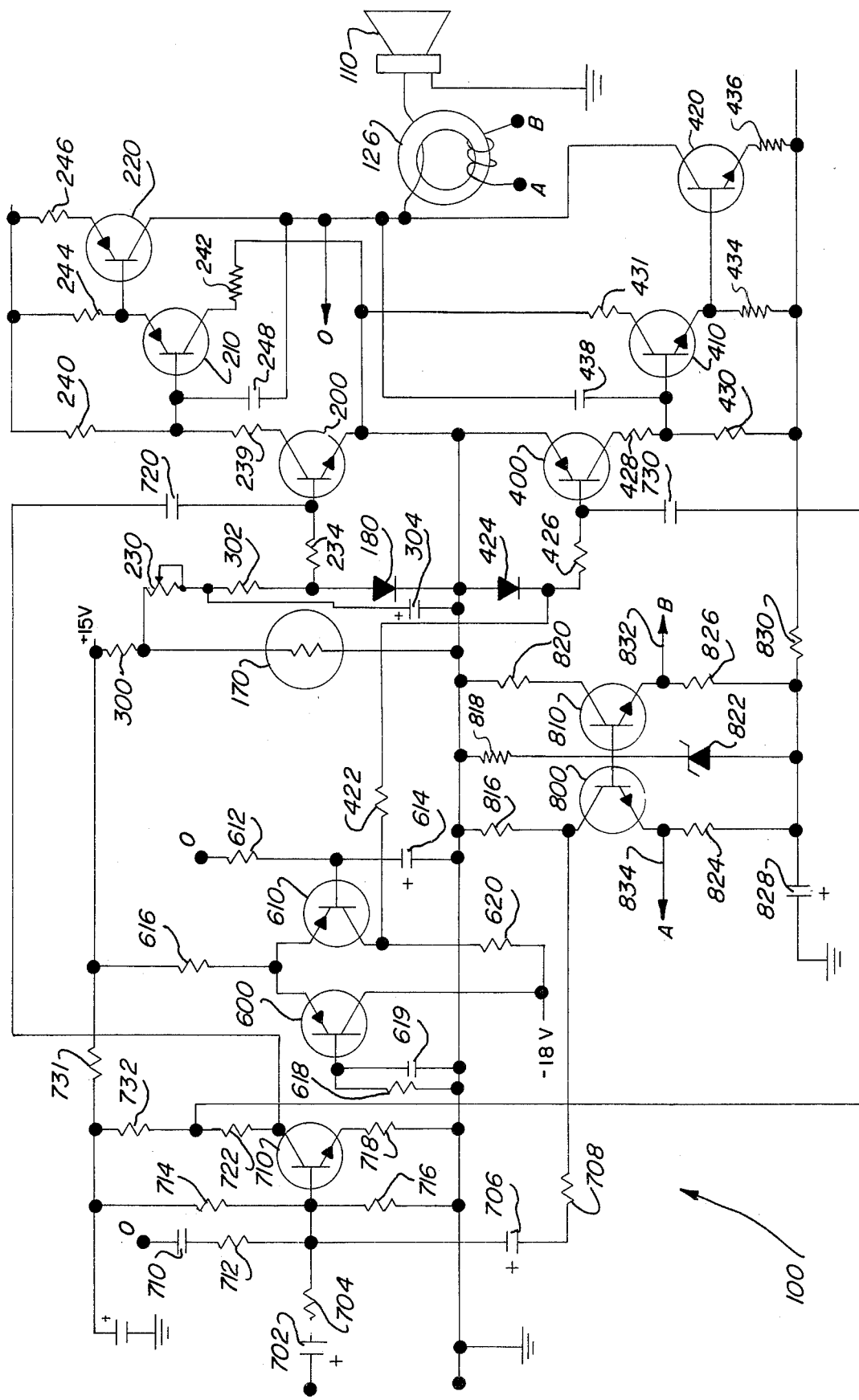
FIG. 11 is a complete schematic diagram of a preferred embodiment of a class-B current source amplifier of the present invention.

The complete circuit diagram of a preferred embodiment in the amplifier 100 of the present invention and the resulting low distortion signal reproduction apparatus are shown in FIG. 11.

In this preferred embodiment, the following components are utilized:
(a) Positive Amplifier Half:
    180 = 1 N 457
    234 = 10 kilo-ohms
    302 = 68 kilo-ohms
    230 = 150 kilo-ohms potentiometer
    300 = 4.7 kilo-ohms
    170 = FENWAL KF41J2 10 kilo-ohms thermistor
    304 = 10 micro-farads
    200 = 2 N 3565
    239 = 4.7 kilo-ohms
    210 = 2 N 4249
    240 = 10 kilo-ohms
    244 = 330 ohms
    220 = 2 N 6053
    246 = 0.33 ohms
    248 = 47 pico-farads
    126 = Supermalloy 2 Mil Toroidal Core Current Transformer
(b) Negative Amplifier Half:
    424 = 1 N 457 or a resistor 4.7 kilo-ohms
    422 = 120 kilo-ohms 426=10 kilo-ohms
400=2 N 4249
428=4.7 kilo-ohms
430=10 kilo-ohms
410=2 N 3565
434=4.7 kilo-ohms
432=330
420=2 N 6055
436=0.33 ohms
438=22 pico-farads (c) LOAD DC VOLTAGE COMPARATOR CIRCUIT:
600=2 N 4249
610=2 N 4249
616=15 kilo-ohms
612=82 kilo-ohms
614=100 micro-farads
620=12 kilo-ohms
618=82 kilo-ohms
619=0.22 micro-farads (d) INPUT CIRCUIT:
702=10 micro-farads
704=39 kilo-ohms
710=10 pico-farads
712=220 kilo-ohms
706=10 micro-farads
708=39 kilo-ohms
716=220 kilo-ohms
714=560 kilo-ohms
731=1 kilo=ohm
732=4.7 kilo-ohms
722=2.2 kilo-ohms
718=4.7 kilo-ohms
710=2 N 3565

(e) ZERO JUNCTION AND CURRENT TO VOLTAGE TRANSFORMATION NETWORK:
822=7.5 V Zener
824=1.8 kilo-ohms
826=1.8 kilo-ohms
816=1.8 kilo-ohms
820=1.8 kilo-ohms
818=3.9 kilo-ohms
830=150 ohms
828=100 micro-farads The above disclosed feedback amplifier is of the high gain type with the positive and negative halves having very large signal current gain without sacrificing high fidelity. The input signal is large being 3 volts. Since the feedback signal being equal and opposite to the input signal, the resultant voltage at the summing junction is very small. The positive and negative halves are separately biased and are direct current coupled to have extremely high current gain. The disclosed feedback amplifier is both ambient and load temperature compensated with the negative amplifier half being slave biased to the positive amplifier half.

While the above represents a prepared mode of operation, it is well known that the solid state technology is quickly moving into new areas and the circuitry herein set forth may take on new arrangements. The substitution of circuitry herein disclosed with new technology or new arrangements of the future will not depart from the novel claims of the invention as herein set forth below.

I claim:

1. A feedback current source amplifier receptive of an audio signal for amplifying said audio siganal and for driving a load with said amplified audio signal, said amplifier comprising:

means for generating a dc bias current, a positive amplifier half receptive of said audio signal for applying an amplified positive audio signal to the input of said load, said positive amplifier half also being simultaneously receptive of said dc bias current for applying an amplified positive dc current to said load input, said positive amplifier comprising:

(a) first, second, and third transistors direct current coupled in tandem for amplifying said positive signal and said dc bias current, both said positive signal and said dc bias current being received at the input of the aforesaid first transistor, the aforesaid third transistor being a power transistor, having its output coupled to said load input, (b) a temperature sensitive diode physically placed near the outer casing of the aforesaid power transistor for sensing the temperature of said outercasing, said diode being interconnected across the output of said generating means for reducing said dc bias current in proportion to a temperature increase in said outer casing due to increasing load demands on said power transistor, said reduced dc bias current being sufficient to substantially deliver said amplified positive dc current, and (c) a thermistor physically placed in the ambient environment surrounding said amplifier for sensing the temperature of said environment, said thermistor being interconnected across the output of said generating means for reducing said dc bias current in proportion as the temperature of said ambient environment increases, said reduced dc bias current being sufficient to substantially deliver said amplified positive dc current, means for generating a predetermined dc voltage level, the first input of a differential amplifier being connected to said load input and receptive of any dc voltage potential at said load input and the second input of said differential amplifier being receptive of said predetermined dc voltage level for comparing said dc voltage potential to said predetermined dc voltage level and for generating a control current whose variation is proportional to the difference between said predetermined dc voltage level and said dc voltage potential, and a negative amplifier half receptive of said audio signal for applying an amplified negative audio signal to said load input, said negative amplifier half also being simultaneously receptive of said control current for applying an amplified negative dc current to said load input, said negative dc current combining with said positive dc current from said positive amplifier at said load input to maintain a zero dc voltage level at said load input, said amplified negative audio signal combining with said amplified positive audio signal to form said amplified audio signal, said negative amplifier comprising:

first, second, and third transistors direct current coupled in tandem for amplifying said negative signal and said dc control current, both said negative signal and said dc control current being received at the input of the aforesaid first transistor, the aforesaid third transistor being a power transistor having its output coupled to said load input.

2. A feedback current source amplifier receptive of an audio signal for amplifying said audio signal and for driving a load with said amplified audio signal, said amplifier comprising:

means for generating a dc bias current, means receptive of said audio signal for applying an amplified positive audio signal to the input of said load, said positive amplifier means also being simultaneously receptive of said dc bias current for applying an amplified positive dc current to said load input, said positive amplifier means comprising:

(a) first, second, and third transistors direct current coupled in tandem for amplifying said positive signal and said dc bias current, both said positive signal and said dc bias current being received at the input of the aforesaid first transistor, the aforesaid third transistor being a power transistor having its output coupled to said load input, (b) means in close proximity to the outer casing of the aforesaid power transistor for sensing the temperature of said outercasing, the aforesaid sensing means being capable of reducing said dc bias current in proportion to a temperature increase in said outer casing due to increasing load demands on said power transistor, said reduced dc bias current being sufficient to substantially deliver said amplified positive current, and (c) means physically placed in the ambient environment surrounding said amplifier for sensing the temperature of said environment, the aforesaid sensing means being capable of reducing said dc bias current in proportion as the temperature of said ambient environment increases, said reduced dc bias current being sufficient to substantially deliver said amplified positive dc current, means for generating a predetermined dc voltage level, means receptive of any dc voltage potential appearing on said load input and of said predetermined dc voltage level for comparing said dc voltage potential to said predetermined voltage level and for generating a control current proportional to the difference between said predetermined level and said dc voltage potential, and means receptive of said audio signal for applying an amplified negative audio signal to said load input, said negative amplifier means also being simultaneously receptive of said control current for applying an amplified negative dc current to said load input proportional to said control current, said negative dc current combining with said positive dc current at said load input to maintain a zero dc voltage level at said load input, said amplified negative audio signal combining with said amplified positive audio signal to form said amplified audio signal, said negative amplifier means comprising first, second, and third transistors direct current coupled in tandem for amplifying said negative signal and said dc control current, both said negative signal and said dc control current being received at the input of the aforesaid first transistor, the aforesaid third transistor being a power transistor having its output coupled to said load input.

3. A feedback current source amplifier receptive of an audio signal for amplifying said audio signal and for driving a load with said amplified audio signal, said amplifier comprising:

means for generating a dc bias current, means receptive of said audio signal for applying an amplified positive audio signal to the input of said load, said positive amplifier means also being simultaneously receptive of said dc bias current for applying an amplified positive dc current to said input, said positive amplifier means comprising:

(a) first, second, and third transistors direct current coupled in tandem for amplifying said positive signal and said dc bias current, both said positive signal and said dc bias current being received at the input of the aforesaid first transistor, the aforesaid third transistor being a power transistor having its output coupled to said load input, and (b) means in close proximity to the outer casing of the aforesaid power transistor for sensing the temperature of said outercasing, the aforesaid sensing means being capable of reducing said dc bias current in proportion to a temperature increase in said outer casing due to increasing load demands on said power transistor, said reduced dc bias current being sufficient to substantially deliver said amplified positive dc current, means for generating a predetermined dc voltage level, means receptive of any dc voltage potential appearing on said load input and of said predetermined dc voltage level for comparing said dc voltage potential to said predetermined voltage level and for generating a control current proportional to the difference between said predetermined level and said dc voltage potential, and means receptive of said audio signal for applying an amplified negative audio signal to said load input, said negative amplifier means also being simultaneously receptive of said control current for applying an amplified negative dc current to said load input proportional to said control current, said negative dc current combining with said positive dc current at said load input to maintain a zero dc voltage level at said load input, said amplified positive audio signal and said amplified negative audio signal combining to form said amplified audio signal, said negative amplifier means comprising first, second, and third transistors direct current coupled in tandem for amplifying said negative signal and said dc control current, both said negative signal and said dc control current being received at the input of the aforesaid first transistor, the aforesaid third transistor being a power transistor having its output coupled to said load input.

4. A feedback current source amplifier receptive of an audio signal for amplifying said audio signal and for driving a load with said amplified audio signal, said amplifier comprising:

means for generating a dc bias current, means receptive of said audio signal for applying an amplified positive audio signal to the input of said load, said positive amplifier means also being simultaneously receptive of said dc bias current for applying an amplified positive dc current to said input, said positive amplifier means comprising:

(a) first, second, and third transistors direct current coupled in tandem for amplifying said positive signal and said dc bias current, both said positive signal and said dc bias current being received at the input of the aforesaid first transistor, the aforesaid third transistor being a power transistor having its output coupled to said load input, and (b) means physically placed in the ambient environment surrounding said amplifier for sensing the temperature of said environment, the aforesaid sensing means being capable of reducing said dc bias current in proportion as the temperature of said ambient environment increases, said reduced dc bias current being sufficient to substantially deliver said amplified positive dc current, means for generating a predetermined dc voltage level, means receptive of any dc voltage potential appearing on said load input and of said predetermined dc voltage level for comparing said dc voltage potential to a predetermined voltage level and for generating a control current proportional to the difference between said predetermined level and said dc voltage potential, and means receptive of said audio signal for applying an amplified negative audio signal to said load input, said negative amplifier means also being simultaneously receptive of said control current for applying an amplified negative dc current to said load input proportional to said control current, said negative dc current combining with said positive dc current at said load input to maintain a zero dc voltage level at said load input, said amplified negative audio signal combining with said amplified positive audio signal to form said amplified audio signal, said negative amplifier means comprising first, second, and third transistors direct current coupled in tandem for amplifying said negative signal and said dc control current, both said negative signal and said dc control current being received at the input of the aforesaid first transistor, the aforesaid third transistor being a power transistor having its output coupled to said load input.

5. A feedback current source amplifier receptive of an audio signal for amplifying said audio signal and for driving a load with said amplified audio signal, said amplifier comprising:

means for generating a dc bias current, means receptive of said audio signal for applying an amplified positive audio signal to the input of said load, said positive amplifier means also being simultaneously receptive of said dc bias current for applying an amplified positive dc current to said load input, said positive amplifier means comprising first, second and third transistors direct current coupled in tandem for amplifying said positive signal and said dc bias current, both said positive signal and said dc bias current being received at the input of the aforesaid first transistor, the aforesaid third transistor being a power transistor having its output coupled to said load input, means for generating a predetermined dc voltage level, means only receptive of any dc voltage potential appearing on said load input and of said predetermined dc voltage level for comparing said dc voltage potential to said predetermined voltage level and for generating a dc control current proportional to the difference between said predetermined level and said dc voltage potential, and means receptive of said audio signal for applying an amplified negative audio signal to said load input, said negative amplifier means also being simultaneously receptive of said control current for applying an amplified negative dc current to said load input proportional to said control current, said negative dc current combining with said positive dc current at said load input to maintain a zero dc voltage at said load input, said amplified negative audio signal combining with said amplified positive audio signal to form said amplified audio signal, said negative amplifier means comprising first, second, and third transistors direct current coupled in tandem for amplifying said negative signal and said dc control current, both said negative signal and said dc control current being received at the input of the aforesaid first transistor, the aforesaid third transistor being a power transistor having its output coupled to said load input.

6. A feedback current source amplifier receptive of an audio signal for amplifying said audio signal and for driving a load with said amplified signal, said amplifier comprising:

means receptive of said audio signal for amplifying the positive portions of said audio signal, the aforesaid means having an output driving stage of amplification for applying the amplified positive audio signal to the input of said load, first means cooperative with said positive amplifying means and responsive to the ambient temperature of the atmosphere around said amplifier for maintaining the amplification of said positive amplifying means at a constant amount when said ambient temperature varies in value, second means cooperative with said positive amplifying means and responsive to the load temperature of said output driving stage for maintaining the amplification of said positive amplifying means at said constant amount when said ambient temperature varies in value, means for generating a predetermined dc voltage level, means receptive of any dc voltage potential at said load input and of said predetermined dc voltage level for comparing said dc voltage potential to said predetermined voltage level and for generating a change signal proportional to the difference between said predetermined level and said dc voltage potential, and means receptive of said audio signal and of said change signal for applying an amplified negative audio signal to said load input, said negative amplifying means being responsive to the magnitude of said change signal for varying the amplification of said negative amplification in an amount that causes said amplified negative signal to be of equal magnitude and of opposite polarity to said amplified positive signal thereby placing a resultant voltage from said positive and negative amplifying means at said input of zero volts dc, said amplified negative audio signal combining with said amplified positive audio signal to form said amplified audio signal.

7. A feedback current source amplifier receptive of an audio signal for amplifying said audio signal and for driving a load with said amplified signal, said amplifier comprising:

means receptive of said audio signal for amplifying the positive portions of said audio signal, the aforesaid means having an output driving stage of amplification for applying the amplified positive audio signal to the input of said load, means cooperative with said positive amplifying means and responsive to the load temperature of said output driving stage for maintaining the amplification of said positive amplifying means at a constant amount when said load temperature varies in value, means for generating a predetermined dc voltage level, means receptive of any dc voltage potential at said load input and of said predetermined dc voltage level for comparing said dc voltage potential to said predetermined voltage level and for generating a change signal proportional to the difference between said predetermined level and said dc voltage potential, and means receptive of said audio signal and of said change signal for applying an amplified negative audio signal to said load input, said negative amplifying means being responsive to the magnitude of said change signal for varying the amplification in an amount that causes said amplified negative signal to be of equal magnitude and of opposite polarity to said amplified positive signal thereby placing a resultant voltage from said positive and negative amplifying means at said input of zero volts dc, said amplified negative audio signal combining with said amplified positive audio signal to form said amplified audio signal.

8. A feedback current source amplifier receptive of an audio signal for amplifying said audio signal and for driving a load with said amplified signal, said amplifier comprising:

means receptive of said audio signal for amplifying the positive portions of said audio signal, the aforesaid means having an output driving stage of amplification for applying the amplified positive audio signal to the input of said load, means cooperative with said positive amplifying means and sensing the ambient temperature of the atmosphere of said amplifier for maintaining the amplification of said positive amplifying means at a constant amount when said ambient temperature varies in value, means for generating a predetermined dc voltage level, means receptive of any dc voltage potential at said load input and of said predetermined dc voltage level for comparing said dc voltage potential to said predetermined voltage level and for generating a change signal proportional to the difference between said determined level and said dc voltage potential, and means receptive of said audio signal and of said change signal for applying an amplified negative audio signal to the input of said load, said negative amplifying means being responsive to the magnitude of said change signal for varying the amplification in an amount that causes said amplified negative signal to be of equal magnitude and of opposite polarity to said amplified positive signal thereby placing a resultant voltage from said positive and negative amplifying means at said input of zero volts dc, said amplified negative audio signal combining with said amplified positive audio signal to form said amplified audio signal.

9. A feedback current source amplifier receptive of an audio signal for amplifying said audio signal and for driving a load with said amplified signal, said amplifier comprising:

means receptive of said audio signal for amplifying the positive portions of said audio signal and for applying an amplified positive audio signal to the input of said load, means for generating a predetermined dc voltage level, means only receptive of any dc voltage potential at said load input and of said predetermined dc voltage level for comparing said dc voltage potential at said load input to said predetermined dc voltage level and for generating a change signal proportional to the difference between said predetermined level and said dc voltage potential, and means receptive of said audio signal and of said change signal for applying an amplified negative audio signal to said load input, said negative amplifying means being responsive to the magnitude of said change signal for varying the amplification of said negative amplification in an amount that causes said amplified negative signal to be of an equal magnitude and of opposite polarity to said amplified positive signal thereby placing a resultant dc voltage from said positive and negative amplifying means at said input of zero volts dc, said amplified negative audio signal combining with said amplified positive audio signal to form said amplified audio signal.

10. A method for amplifying an audio signal with an audio amplifier, said amplifier having two symmetrical amplifying halves, each half having an output power stage, said method comprising the steps of:

amplifying only the positive going portions of the audio signal with the first symmetrical amplifier half, applying the amplified positive portions to the input of a load, sensing only the presence of any dc voltage generated as a result of the amplification by the first symmetrical amplifier half at the input of the load, generating a control voltage change signal when the aforesaid sensed dc voltage differs from a predetermined value of dc voltage, the control voltage change signal being proportional to the difference in voltages, amplifying only the negative going portions of the audio signal with the second symmetrical amplifier half in response to the generated control voltage change signal by an amount that causes the combination of the amplified positive and negative going signals at the load input to have a resultant dc voltage of substantially zero volts dc, and applying the amplified negative portions to the input of the load.

11. A method for amplifying an audio signal with an audio amplifier, said amplifier having two symmetrical amplifying halves, each half having an output power stage, said method comprising the steps of:

amplifying only the positive going portions of the audio signal with the first symmetrical amplifier half, applying the amplified positive portions of the audio signal to the input of a load, sensing the ambient temperature of the atmospheric environment in the vicinity of the audio amplifier, maintaining the positive amplification of the audio signal in the first symmetrical amplifier half at a predetermined amount in response to any changes in the sensed ambient temperature, sensing the presence of any dc voltage generated as a result of the amplification by the first symmetrical amplifier half at the input of the load, generating a control voltage change signal when the aforesaid sensed dc voltage differs from a predetermined value of dc voltage, the control voltage change signal being proportional to the differences in voltages, amplifying only the negative going portions of the audio signal with the second symmetrical amplifier half in response to the generated control voltage change signal by an amount that causes the combination of the amplified positive and negative going signals at the load input to have a resultant dc voltage of substantially zero volts dc, and applying the amplified negative portions at the input of the load.

12. A method for amplifying an audio signal with an audio amplifier, said amplifier having two symmetrical amplifying halves, each half having an output power stage, said method comprising the steps of:

amplifying only the positive going portions of the audio signal with the first symmetrical amplifier half, applying the amplified positive portions of the audio signal from the output stage of the first half to the input of a load, sensing the load temperature variations occurring at the output power stage of the first amplifier half, maintaining the positive amplification in the first amplifier half of the audio signal at a predetermined amount in response to sensed load temperature variations, sensing the presence of dc voltage generated as a result of the positive amplification at the input of the load, generating a control voltage change signal when the aforesaid sensed dc voltage differs from a predetermined value of dc voltage, amplifying only the negative going portions of the audio signal in response to the generated control voltage change signal by an amount that causes the combination of the amplified positive and negative going signals to have a resultant dc voltage at the input of substantially zero volts dc, and applying the amplified negative portions at the input of the load.

13. A current source amplifier as part of a low distortion signal reproduction apparatus receptive of an audio signal and of a feedback signal from said apparatus for amplifying the audio signal and for driving a load with said amplified signal, said amplifier comprising:

means receptive of said audio signal for applying an amplified positive signal to the input of said load, said applying means having an output driving stage for placing said amplified positive signal on said load input, means cooperative with said positive amplifying means and sensing the load temperature of said output driving stage of said positive amplifier for maintaining the amplification at a constant value of said positive amplifying means when said load temperature varies in value, means for generating a predetermined dc voltage level, means receptive of any dc voltage potential at said load input and of said predetermined dc voltage level for comparing said dc voltage potential to said predetermined voltage level and for generating a change signal proportional to the difference between said predetermined voltage level and said dc voltage potential, and means receptive of said audio signal and of said change signal for applying an amplified negative signal to said load input, said negative amplifying means being responsive to the magnitude of said change signal for varying the amplification in an amount that causes said amplified negative signal to be of equal magnitude and of opposite polarity to said amplified positive signal thereby producing a resultant voltage from said positive and negative amplifying means at said load input of zero volts dc, said amplified negative audio signal combining with said amplified positive audio signal to form said amplified signal.

14. A current source amplifier as part of low distortion signal reproduction apparatus receptive of an audio signal and of a feedback signal from said apparatus for amplifying the audio signal for driving a load with said amplified signal, said amplifier comprising:

means receptive of said audio signal for applying an amplified positive signal to the input of said load, means cooperative with said positive amplifying means and sensing the ambient temperature of the atmosphere in the vicinity of said amplifier for maintaining the amplification of said positive amplifying means at a constant amount when said ambient temperature varies in value, means for generating a predetermined dc voltage level, means receptive of any dc voltage at said load input and of said predetermined dc voltage level for comparing said dc voltage potential to said predetermined voltage level and for generating a change signal proportional to the difference between said predetermined voltage level and said dc voltage potential, and means receptive of said audio signal and of said change signal for applying an amplified negative signal to said load input, said negative amplifying means being responsive to the magnitude of said change signal change for varying the amplification in an amount that causes said amplified negative signal to be of equal magnitude and of opposite polarity to said amplified positive signal thereby producing a resultant voltage from said positive and negative amplifying means at said load input of zero volts dc, said amplified negative signal combining with said amplified positive signal to form said amplified signal.

15. A current source amplifier as part of a low distortion signal reproduction apparatus receptive of an audio signal and of a feedback signal from said apparatus for amplifying the audio signal and for driving a load with said amplified signal, and amplifier comprising:

means receptive of said audio signal for applying an amplified positive signal to the input of said load, means for generating a predetermined dc voltage level, means only receptive of any dc voltage potential at said load input and of said predetermined dc voltage level for comparing said dc voltage potential to said predetermined voltage level and for generating a change signal proportional to the difference between said predetermined level and said dc voltage potential, and means receptive of said audio signal and of said change signal for applying an amplified negative signal to said load input, said negative amplifying means being responsive to the magnitude of said change signal for varying the amplification in an amount that causes said amplified negative signal to be of equal magnitude and of opposite polarity to said amplified positive signal thereby producing a resultant voltage from said positive and negative amplifying means at said load input of zero volts dc, said amplified negative signal combining with said amplified positive signal to form said amplified signal.

16. An audio amplifier receptive of an audio signal for amplifying said audio signal and for driving a load with said amplified audio signal, said amplifier comprising:

means receptive of said audio signal for amplifying the positive going portions of said audio signal, means for delivering said amplified positive portions of said audio signal to said load input, means only receptive of any dc voltage appearing at said load input for generating a control signal, said control signal being proportional to the aforesaid dc voltage, means complimentary to said positive amplifying means and receptive of said audio signal and of said control signal for amplifying the negative going portions of said audio signal, the amount of the aforesaid amplification being controlled by said control signal, and means for delivering said amplified negative portions of said audio signal to said load input, said control signal being capable of causing the resultant dc voltage created by the combination of said amplified positive and negative portions of said audio signal at said load input to be substantially zero volts dc.

17. The audio amplifier of claim 16 further comprising:

means for detecting the amount of current in said load input and for generating a feedback signal, and means receptive of said feedback signal for combining said feedback signal with said audio signal.

18. An audio amplifier receptive of an audio signal for amplifying said audio signal and for driving a load with said amplified signal, said amplifier comprising:

means receptive of said audio signal for amplifying the positive going portions of said audio signal and for delivering said amplified positive portions of said audio signal to said load input, means complimentary to said positive amplifying means and receptive of said audio signal for amplifying the negative going portions of said audio signal and for delivering said amplified negative portions of said audio signal to said load input, the amplification of said negative amplifying means being sufficient to maintain the value of any dc voltage appearing at said load input to be substantially zero, and means for detecting the amount of current in said load input and for combining a single feedback signal proportional to said current with said audio signal.

* * * * *